United States Patent
Zou

(10) Patent No.: US 10,171,040 B1
(45) Date of Patent: Jan. 1, 2019

(54) TRANS-IMPEDANCE AMPLIFIER

(71) Applicant: Hangzhou Hongxin Microelectronics Technology Co., Ltd., Hangzhou (CN)

(72) Inventor: Hehong Zou, Hangzhou (CN)

(73) Assignee: HANGZHOU HONGXIN MICROELECTRONICS TECHNOLOGY CO., LTD., Hangzhou (CN)

( * ) Notice: Subject to any disclaimer, the term of this patent is extended or adjusted under 35 U.S.C. 154(b) by 0 days.

(21) Appl. No.: 15/844,609

(22) Filed: Dec. 17, 2017

(30) Foreign Application Priority Data

Jul. 25, 2017 (CN) .......................... 2017 1 0613707

(51) Int. Cl.
*H03F 3/08* (2006.01)
*H03F 1/26* (2006.01)
*H03G 3/30* (2006.01)
*H03F 3/45* (2006.01)

(52) U.S. Cl.
CPC ............... *H03F 1/26* (2013.01); *H03F 3/082* (2013.01); *H03F 3/45475* (2013.01); *H03G 3/3084* (2013.01)

(58) Field of Classification Search
CPC ........................................................ H03F 3/08
USPC ...................................... 330/308; 250/214 A
See application file for complete search history.

(56) References Cited

U.S. PATENT DOCUMENTS

| | | | |
|---|---|---|---|
| 8,509,629 B2* | 8/2013 | Zou ........................ | H03F 3/082 330/277 |
| 9,276,535 B2* | 3/2016 | van Sinderen .......... | H03F 3/193 |
| 2008/0150600 A1* | 6/2008 | Taylor .................... | H03K 5/156 327/175 |
| 2011/0018627 A1* | 1/2011 | Sutardja .................... | H03F 1/08 330/100 |
| 2013/0135054 A1* | 5/2013 | Ito ............................. | H03F 3/08 330/308 |
| 2015/0145597 A1* | 5/2015 | Huang ................ | H03F 3/45071 330/260 |

* cited by examiner

*Primary Examiner* — Henry Choe
(74) *Attorney, Agent, or Firm* — Perkins Coie LLP

(57) ABSTRACT

The present disclosure provides a trans-impedance amplifier, comprising: an equivalent secondary amplifier module, having an input end and an output end, wherein the input end is coupled to an optical diode and used for accessing an input voltage signal, and the output end is used for outputting a secondarily amplified first voltage signal; an inverting amplifier unit, coupled to the output end of the equivalent secondary amplifier module and used for accessing the first voltage signal and outputting an inverting amplified voltage signal, the inverting amplifier unit comprising a third N-type transistor and a fourth N-type transistor coupled to the third N-type transistor; and a feedback resistor, coupled to the input end of the equivalent secondary amplifier module and an output end of the inverting amplifier unit. The feedback resistor of the trans-impedance amplifier can be not restricted by original conditions, may increase resistance, reduce input noise and improve sensitivity.

7 Claims, 2 Drawing Sheets

TRANS-IMPEDANCE AMPLIFIER

CROSS-REFERENCE TO RELATED APPLICATIONS

This Non-provisional application claims priority under 35 U.S.C. § 119(a) on Patent Application No(s). 201710613707.3 filed in China on Jul. 25, 2017, the entire contents of which are hereby incorporated by reference.

BACKGROUND OF THE INVENTION

Field of the Invention

The present disclosure relates to the field of complementary metal oxide semiconductor (CMOS) technology and, more particularly, to a trans-impedance amplifier which expands gain, reduces noise and is simple in design.

Description of the Related Art

A trans-impedance amplifier (TIA) is one type of amplifiers. Types of the amplifiers are defined according to types of input/output signal of the amplifiers. Having an advantage of high bandwidth, the TIA generally is used in high speed circuits. For example, the TIA is widely used in photoelectric transmission communication systems.

Magnitude of equivalent input noise of a trans-impedance amplifier is one of important indicators of measuring its transmission performance. It is necessary to reduce noise output to improve the sensitivity of the trans-impedance amplifier, and one of manners of reducing the noise output may be implemented by increasing transimpedance. Theoretically, the greater the transimpedance is, the smaller the noise is. However, the transconductance is restricted by conditions. A prerequisite of increasing the transconductance is presence of a good frequency response, and whether the frequency response is good or not may be embodied from a gain-bandwidth product. To provide stable voltage operating points, existing trans-impedance amplifiers adopt a manner of combining positive channel metal oxide semiconductor (PMOS) and Negative channel metal oxide semiconductor (NMOS) to implement the above effects. However, due to limitations of working characteristics of the PMOS, $f_T$ of the trans-impedance amplifiers is smaller, the equivalent capacitance is larger, which to some extent causes the gain-bandwidth product to lessen, thereby making a value of the transconductance difficult to further largen, and the magnitude of output noise of the trans-impedance amplifiers difficult to be further reduced.

BRIEF SUMMARY OF THE INVENTION

The present disclosure provides a trans-impedance amplifier to solve the above problems.

To solve the above problems, an embodiment of the present disclosure provides a trans-impedance amplifier, including:
an equivalent secondary amplifier module, having an input end and an output end, the input end being coupled to an optical diode and used for accessing an input voltage signal, the output end being used for outputting a secondarily amplified first voltage signal;
an inverting amplifier unit, coupled to the output end of the equivalent secondary amplifier module and used for accessing the first voltage signal and outputting an inverting amplified voltage signal, the inverting amplifier unit comprising a third N-type transistor and a fourth N-type transistor, both a first end and a second end of the third N-type transistor being used for receiving a third DC voltage signal, a third end thereof being used for outputting an inverting amplified voltage signal; a first end of the fourth N-type transistor being coupled to the third end of the third N-type transistor, a second end thereof being coupled to the output end of the equivalent secondary amplifier module and used for receiving the first voltage signal, and a third end thereof being grounded; and
a feedback resistor, coupled to the input end of the equivalent secondary amplifier module and an output end of the inverting amplifier unit.

As an embodiment, the equivalent secondary amplifier module may include:
a primary amplifier unit, which may be coupled to an optical diode and used for accessing an input voltage for a primary amplification; and
a secondary amplifier unit, which may be coupled to the primary amplifier unit, and may be used for secondarily amplifying a signal outputted by the primary amplifier unit and outputting a first voltage amplified by the primary amplifier unit and the secondary amplifier unit.

As an embodiment, the primary amplifier unit may include:
a first P-type transistor, a first end thereof may be used for receiving a first DC voltage signal, a second end thereof may be coupled to an optical diode, and a third end thereof may be coupled to the secondary amplifier unit; and
a first N-type transistor, a first end thereof may be coupled to the third end of the first P-type transistor, a second end thereof may be coupled to an optical diode and a third end thereof may be grounded.

As an embodiment, the secondary amplifier unit may include:
a second P-type transistor, a first end thereof may be used for receiving a second DC voltage signal, a second end thereof may be coupled to the primary amplifier unit, and a third end thereof may be used for outputting the first voltage;
a second N-type transistor, a first end thereof may be coupled to the third end of the second P-type transistor, a second end thereof may be coupled to the primary amplifier unit, and a third end thereof may be grounded; and
a first feedback resistor, which may be coupled between the second end of the second P-type transistor and the third end of the second N-type transistor.

As an embodiment, the inverting amplifier unit may further include a resistor, wherein an end of the resistor may be used for receiving the third DC voltage signal, and another end thereof may be coupled to the second end of the third N-type transistor.

As an embodiment, the third N-type transistor may adopt Native n-channel metal-oxide-semiconductor field-effect transistor (NFET).

Compared with the prior art, beneficial effects of the present disclosure are as below: a gain-bandwidth product of an inverting amplifier unit composed of dual-N-type transistors may be increased. Therefore, when the same fixed bandwidth is given, the gain-bandwidth product of the trans-impedance amplifier of the present disclosure is much higher than that of a trans-impedance amplifier in the prior art. Thus, the feedback resistor RF of the trans-impedance amplifier can be not restricted by original conditions and may be designed to be a resistor having a high resistance value, so that the input noise of the trans-impedance amplifier is further reduced, and the sensitivity of the trans-impedance amplifier is enhanced.

Figure 1:
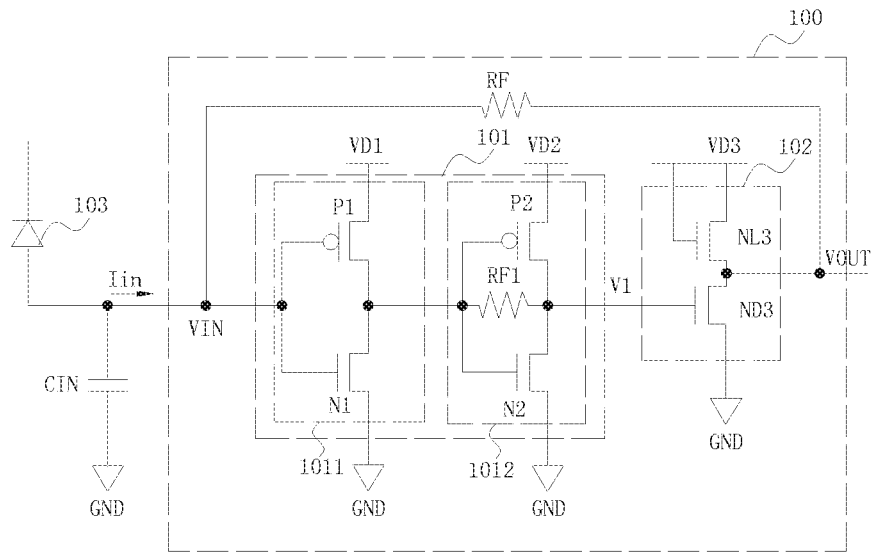
FIG. 1 is a schematic diagram of a trans-impedance amplifier according to Embodiment I of the present disclosure.

Reference numeral: trans-impedance amplifier 100; equivalent secondary amplifier module 101; primary amplifier unit 1011; secondary amplifier unit 1012; inverting amplifier unit 102; optical diode 103.

DETAILED DESCRIPTION OF THE INVENTION

The foregoing and additional technical features and advantages of the present disclosure are described clearly and completely below, in conjunction with the accompanying drawings. Apparently, the described embodiments are some but not all of the embodiments of the present disclosure.

As shown in FIG. 1, the trans-impedance amplifier 100 includes an equivalent secondary amplifier module 101, an inverting amplifier unit 102 and a feedback resistor RF. The equivalent secondary amplifier module 101 is used for receiving an input voltage signal VIN and outputting a secondarily amplified first voltage signal V1. The equivalent secondary amplifier module 101 has an input end and an output end, wherein the input end is coupled to an optical diode 103 and is used for accessing the input voltage signal VIN, and the output end is used for outputting the secondarily amplified first voltage signal V1. The equivalent secondary amplifier module 101 includes a primary amplifier unit 1011 and a secondary amplifier unit 1012. The primary amplifier unit 1011 is used for receiving the input voltage signal VIN and primarily amplifying the input voltage signal VIN. The secondary amplifier unit 1012 is coupled to the primary amplifier unit 1011 and is used for secondarily amplifying the input voltage signal VIN that has been primarily amplified and outputting the secondarily amplified first voltage signal V1. The inverting amplifier unit 102 is used for receiving the first voltage signal V1 and outputting an amplified voltage signal VOUT. The inverting amplifier unit 102 has an input end and an output end, wherein the input end is coupled to an output end of the secondary amplifier unit 1012 and is used for accessing the first voltage signal V1, and the output end is used for outputting the amplified voltage signal VOUT. The feedback resistor RF is coupled to the input end of the equivalent secondary amplifier module 101 and the output end of the inverting amplifier unit 102.

The equivalent secondary amplifier module 101 actually performs a primary amplification, but may respond to a secondary amplification, which may reduce response time and increase a response frequency compared with an equivalent secondary amplification. The equivalent secondary amplifier module 101 includes a primary amplifier unit 1011 and a secondary amplifier unit 1012. The primary amplifier unit 1011 includes: a first P-type transistor P1 and a first N-type transistor N1. A first end of the first P-type transistor is used for receiving a first DC voltage signal VD1, a second end thereof is coupled to the optical diode 103, and a third end thereof is coupled to the secondary amplifier unit 1012. A first end of the first N-type transistor N1 is coupled to the third end of the first P-type transistor P1, a second end thereof is coupled to the optical diode 103 and a third end thereof is grounded. The secondary amplifier unit 1012 includes: a second P-type transistor P2, a second N-type transistor N2 and a first feedback resistor RF1. A first end of the second P-type transistor P2 is used for receiving a second DC voltage signal VD2, a second end thereof is coupled to the primary amplifier unit 1011, and a third end thereof is used for outputting the first voltage signal V1. A first end of the second N-type transistor N2 is coupled to the third end of the second P-type transistor P2, a second end thereof is coupled to the primary amplifier unit 1011, and a third end thereof is grounded. The first feedback resistor RF1 is coupled between the second end of the second P-type transistor P2 and the third end of the second N-type transistor N2.

Embodiment I

The inverting amplifier unit 102 includes a third N-type transistor NL3 and a fourth N-type transistor ND3. Both a first end and a second end of the third N-type transistor NL3 are used for receiving a third DC voltage signal VD3, a third end thereof is used for outputting the amplified voltage signal VOUT. A first end of the fourth N-type transistor ND3 is coupled to the third end of the third N-type transistor NL3, a second end thereof is coupled to the output end of the equivalent secondary amplifier module 101 and is used for receiving the first voltage signal V1, and a third end thereof is grounded.

The equivalent secondary amplifier module 101, the inverting amplifier unit 102 and the feedback resistor RF of the trans-impedance amplifier 100 form a three-stage operation amplifier. As the primary amplifier unit in the three-stage operation amplifier, the inverting amplifier unit adopts structures of two N-type transistors to implement a primary inverting amplification. Gains are increased to the utmost extent using a connection structure of the two N-type transistors, and no negative effect is exerted on bandwidth. Therefore, a gain-bandwidth product of the trans-impedance amplifier 100 may be increased to a great extent. The gain of the equivalent secondary amplifier module 101 is Av=$(g_{mp1}+g_{mn1}) \times RF1$, the gain of the inverting amplifier unit 102 is $$Av = \frac{g_{mND3}}{g_{mNL3}},$$

the gain of the trans-impedance amplifier 100 is $$Av = (g_{mp1} + g_{mn1}) \times RF1 \times \frac{g_{mND3}}{g_{mNL3}},$$

and in the above formula, $g_m$ represents a conductance of each transistor.

The gain-bandwidth product of an inverting amplifier unit composed of dual-N-type transistors may be increased. Therefore, when the same fixed bandwidth is given, the gain-bandwidth product of the trans-impedance amplifier of the present disclosure is much higher than that of a trans-impedance amplifier in the prior art. Thus, the feedback resistor RF of the trans-impedance amplifier 100 may be not restricted by original conditions, and may be designed to be a resistor having a high resistance value, so that the input noise of the trans-impedance amplifier is further reduced, and the sensitivity of the trans-impedance amplifier 100 is enhanced.

Embodiment II

Figure 2:
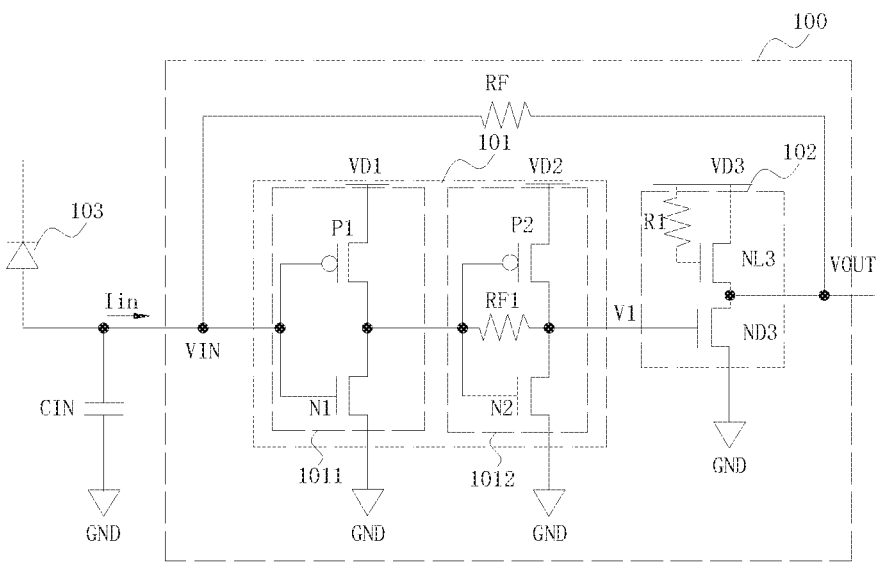
FIG. 2 is a schematic diagram of a trans-impedance amplifier according to Embodiment II of the present disclosure.

As shown in FIG. 2, as another embodiment of the present disclosure, the inverting amplifier unit 102 further includes a resistor R1. An end of the resistor R1 receives a third DC voltage, and another end thereof is coupled to the second end of the third N-type transistor. A resistor is coupled to the second end, so that the resistor R1 may serve as an active inductor. The bandwidth of the inverting amplifier unit 102 may be increased, so that the gain-bandwidth product of the whole trans-impedance amplifier 100 is increased.

To reduce a voltage drop across two ends of the third N-type transistor NL3, the third N-type transistor NL3 in the embodiment of the present disclosure adopts Native NFET.

In another embodiment of the present disclosure, the equivalent secondary amplifier module 101 and the inverting amplifier unit 102 are interchanged in position, so that the input end of the inverting amplifier unit 102 is coupled to the optical diode 103, and the output end of the equivalent secondary amplifier module 101 is used for outputting the amplified voltage signal.

Embodiment III

Figure 3:
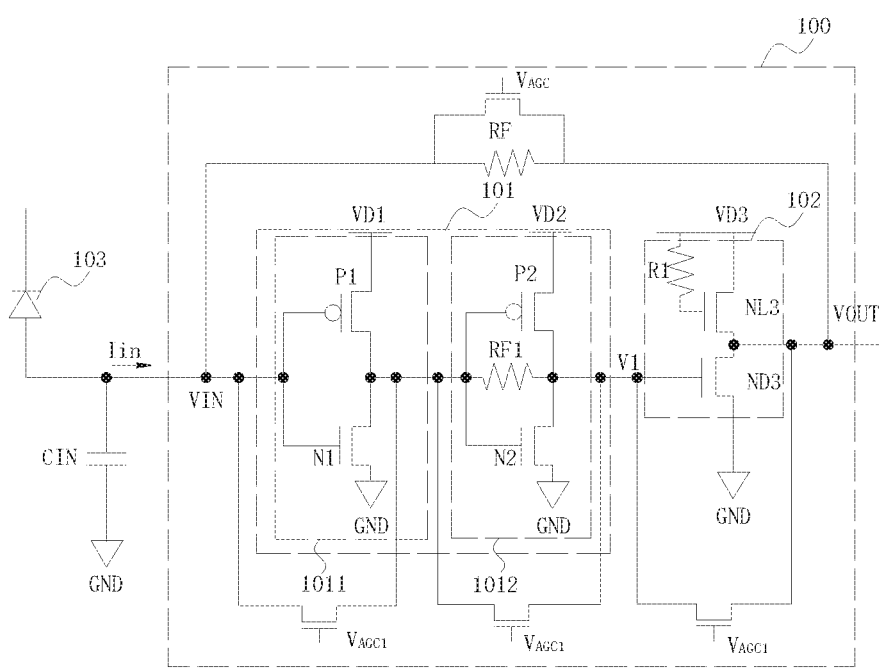
FIG. 3 is a schematic diagram of a trans-impedance amplifier according to Embodiment III of the present disclosure.

As shown in FIG. 3, as another embodiment of the present disclosure, each of the three units used for signal amplification may be provided with an N-type transistor between the input end and the output end thereof, and an N-type transistor is also provided between two ends of the feedback resistor. This N-type transistor may implement automatic gain control (AGC) of the trans-impedance amplifier.

In addition to the above functions, the conductance of the P-type transistor and the N-type transistor in the trans-impedance amplifier 100 may be reduced when noise and sensitivity are not major design objectives of the trans-impedance amplifier 100. Current consumption may be reduced when the conductance is reduced, and thus power consumption reduction of the trans-impedance amplifier 100 is implemented.

In the above specific embodiments, the objectives, the technical solutions and the beneficial effects of the present disclosure are further described in detail. However, it should be understood that the above embodiments are merely specific embodiments of the present disclosure and are not intended to limit the scope of protection of the present disclosure. It is particularly pointed out that for those skilled in the art, all modifications, equivalent substitutions and improvements made within the spirit and principle of the present disclosure shall fall within the scope of protection of the present disclosure.

What is claimed is:

1. A trans-impedance amplifier, comprising:
  an equivalent secondary amplifier module, having an input end and an output end, the input end being coupled to an optical diode and used for accessing an input voltage signal, the output end being used for outputting a secondarily amplified first voltage signal;
  an inverting amplifier unit, coupled to the output end of the equivalent secondary amplifier module and used for accessing the first voltage signal and outputting an inverting amplified voltage signal, the inverting amplifier unit comprising a third N-type transistor and a fourth N-type transistor, both a first end and a second end of the third N-type transistor being used for receiving a third DC voltage signal, a third end thereof being used for outputting an inverting amplified voltage signal; a first end of the fourth N-type transistor being coupled to the third end of the third N-type transistor, a second end thereof being coupled to the output end of the equivalent secondary amplifier module and used for receiving the first voltage signal, and a third end thereof being grounded; and
  a feedback resistor, coupled to the input end of the equivalent secondary amplifier module and an output end of the inverting amplifier unit.

2. The trans-impedance amplifier according to claim 1, wherein the equivalent secondary amplifier module comprises:
  a primary amplifier unit, coupled to an optical diode and used for accessing an input voltage for a primary amplification; and
  a secondary amplifier unit, coupled to the primary amplifier unit, and used for secondarily amplifying a signal outputted by the primary amplifier unit, and outputting a first voltage amplified by the primary amplifier unit and the secondary amplifier unit.

3. The trans-impedance amplifier according to claim 2, wherein the primary amplifier unit comprises:
  a first P-type transistor, a first end thereof being used for receiving a first DC voltage signal, a second end thereof being coupled to an optical diode, and a third end thereof being coupled to the secondary amplifier unit; and
  a first N-type transistor, a first end thereof being coupled to the third end of the first P-type transistor, a second end thereof being coupled to an optical diode and a third end thereof being grounded.

4. The trans-impedance amplifier according to claim 2, wherein the secondary amplifier unit comprises:
  a second P-type transistor, a first end thereof being used for receiving a second DC voltage signal, a second end thereof being coupled to the primary amplifier unit, and a third end thereof being used for outputting the first voltage;
  a second N-type transistor, a first end thereof being coupled to the third end of the second P-type transistor, a second end thereof being coupled to the primary amplifier unit, and a third end thereof being grounded; and
  a first feedback resistor, coupled between the second end of the second P-type transistor and the third end of the second N-type transistor.

5. The trans-impedance amplifier according to claim 1, wherein the inverting amplifier unit further comprises a resistor, an end of the resistor being used for receiving the third DC voltage signal, and another end thereof being coupled to the second end of the third N-type transistor.

6. The trans-impedance amplifier according to claim 1, wherein the third N-type transistor adopts Native NFET.

7. The trans-impedance amplifier according to claim 5, wherein the third N-type transistor adopts Native NFET.

* * * * *